(12) United States Patent
Outram

(10) Patent No.: US 11,431,331 B2
(45) Date of Patent: Aug. 30, 2022

(54) SWITCHING APPARATUS

(71) Applicant: GENERAL ELECTRIC TECHNOLOGY GMBH, Baden (CH)

(72) Inventor: John Lewis Outram, Stafford (GB)

(73) Assignee: General Electric Technology Gmbh, Baden (CH)

( * ) Notice: Subject to any disclaimer, the term of this patent is extended or adjusted under 35 U.S.C. 154(b) by 14 days.

(21) Appl. No.: 16/967,856

(22) PCT Filed: Feb. 6, 2019

(86) PCT No.: PCT/EP2019/052944
§ 371 (c)(1),
(2) Date: Aug. 6, 2020

(87) PCT Pub. No.: WO2019/154880
PCT Pub. Date: Aug. 15, 2019

(65) Prior Publication Data
US 2021/0399725 A1 Dec. 23, 2021

(30) Foreign Application Priority Data
Feb. 8, 2018 (EP) ..................................... 18155805

(51) Int. Cl.
*H03K 17/0812* (2006.01)
*H03K 17/16* (2006.01)

(52) U.S. Cl.
CPC ..... *H03K 17/08128* (2013.01); *H03K 17/165* (2013.01)

(58) Field of Classification Search
CPC ........................ H03K 17/08128; H03K 17/165
(Continued)

(56) References Cited

U.S. PATENT DOCUMENTS

2004/0027762 A1 2/2004 Ohi et al.
2016/0209853 A1\* 7/2016 Deboy .................. H02M 1/083
2017/0288661 A1 10/2017 Laschek-Enders

OTHER PUBLICATIONS

International Search Report of PCT/EP2019/052944 dated Apr. 4, 2019.
(Continued)

*Primary Examiner* — Tomi Skibinski
(74) *Attorney, Agent, or Firm* — Eversheds Sutherland (US) LLP

(57) ABSTRACT

A switching apparatus (20) comprises first and second current paths, each current path configured to be capable of conducting an electrical current, the first current path including a first switching element (28) connected in parallel with a first passive current check element (30), the switching apparatus (20) further including a switching controller configured to selectively control the switching of the first switching element (28), wherein the switching controller is configured to selectively switch the first switching element (28) at a first intra-current path switching speed to commutate the electrical current between the first switching element (30) and the first passive current check element (32), the switching controller is configured to selectively switch the first switching element (28) at a first inter-current path switching speed to commutate the electrical current between the first and second current paths, and the first intra-current path switching speed is faster or slower than the first inter-current path switching speed.

15 Claims, 2 Drawing Sheets

(58) Field of Classification Search
USPC .................................................. 327/108–112
See application file for complete search history.

(56) References Cited

OTHER PUBLICATIONS

European Search Report of European Application No. 18155805.7 dated Aug. 6, 2018.

* cited by examiner

SWITCHING APPARATUS

CROSS-REFERENCE TO RELATED APPLICATIONS

This application is a U.S. National Stage Application under 35 U.S.C. 371 and claims the priority benefit of International Application No. PCT/EP2019/052944 filed Feb. 6, 2019, which claims priority to EP 18155805.7, filed Feb. 8, 2018, which are both incorporated herein by reference.

This invention relates to a switching apparatus and to a method of operating a switching apparatus.

It is known to use a switching apparatus to commutate an electrical current between multiple current paths.

According to a first aspect of the invention, there is provided a switching apparatus comprising first and second current paths, each current path configured to be capable of conducting an electrical current, the first current path including a first switching element connected in parallel with a first passive current check element, the switching apparatus further including a switching controller configured to selectively control the switching of the first switching element, wherein the switching controller is configured to selectively switch the first switching element at a first intra-current path switching speed to commutate the electrical current between the first switching element and the first passive current check element, the switching controller is configured to selectively switch the first switching element at a first inter-current path switching speed to commutate the electrical current between the first and second current paths, and the first intra-current path switching speed is faster or slower than the first inter-current path switching speed.

It will be understood that the invention is applicable to switching apparatus comprising two or more current paths, each of which is configured to be capable of conducting an electrical current, i.e. the electrical current is not limited to flowing in the first and second current paths. For example, the switching apparatus may include the first current path, the second current path and at least one other current path.

The resulting inductance from the commutation of the electrical current, or also known as commutation inductance, affects the switching performance of the switching apparatus, such as switching losses and voltage transients. The commutation inductance for the commutation of electrical current between the first switching element and the first passive current check element may be different from the commutation inductance for the commutation of electrical current between the first and second current paths. This may result in a less than desirable switching performance of the switching apparatus when the same switching speed is used for both of the switching commutation operations.

The provision of the switching controller of the switching apparatus of the invention permits adjustment of the respective switching speed for each of the switching commutation operations relative to the corresponding commutation inductance to provide a more optimal performance of the switching apparatus when compared to using the same switching speed for both of the switching commutation operations, and therefore permits optimisation of the switching performance of the switching apparatus when carrying out the switching commutation operations to commutate the electrical current between the first switching element and the first passive current check element and between the first and second current paths. For example, the switching controller may be configured to set the intra-current path switching speed to regulate, preferably minimise, switching loss in the switching apparatus, and/or the switching controller may be configured to set the inter-current path switching speed to regulate, preferably minimise, voltage transient and/or ringing in the switching apparatus.

In embodiments of the invention, the second current path may include a second switching element. The switching controller may be configured to selectively switch the second switching element at a second inter-current path switching speed to commutate the electrical current between the first and second current paths. The first intra-current path switching speed may be faster or slower than the second inter-current path switching speed.

In further embodiments of the invention employing the use of the second switching element, the second current path may include the second switching element connected in parallel with a second passive current check element. The switching controller may be configured to selectively switch the second switching element at a second intra-current path switching speed to commutate the electrical current between the second switching element and the second passive current check element. The second intra-current path switching speed may be faster or slower than the first inter-current path switching speed. The second intra-current path switching speed may be faster or slower than the second inter-current path switching speed.

The invention may be used to improve the switching performance of a switching apparatus in which both of the current paths include the respective switching elements and further include the respective passive current check elements.

Further adjustments to the intra-current path and inter-current path switching speeds may be carried out to optimise the switching performance of the switching apparatus. For example, the first intra-current path switching speed may be faster than or slower than or the same as the second intra-current path switching speed, and/or the first inter-current path switching speed may be faster than or slower than or the same as the second inter-current path switching speed.

In still further embodiments of the invention, the switching controller may be configured to selectively set the intra-current path and inter-current path switching speeds to be the same or substantially the same when the electrical current is below a predefined current threshold.

Under circumstances in which there is uncertainty about the direction of electrical current in the switching apparatus, setting the intra-current path and inter-current path switching speeds to be the same or substantially the same at low levels of the electrical current allows for controlled switching of the switching apparatus without significantly affecting the overall switching performance of the switching apparatus. This is because the difference in switching performance of the switching apparatus between using different switching speeds and the same switching speed may be minimal at low levels of the electrical current, especially when the electrical current approaches zero.

The switching controller may vary in configuration. For example, the switching controller may include: a plurality of single switching speed control circuits, each single switching speed control circuit configured to provide a switching signal at a respective single switching speed; or a variable switching speed control circuit configured to provide a switching signal at two or more switching speeds.

The or each switching element and the or each passive current check element of the invention may vary in configuration, non-limiting examples of which are described as follows. The or each switching element may be configured to be switchable to a reverse conduction state so that a reverse current flowing in the corresponding current path flows preferentially through that switching element than through the corresponding parallel-connected passive current check element. The or each switching element may include a transistor, such as a metal oxide semiconductor field effect transistor (MOSFET). The transistor may be formed of silicon carbide. The or each passive current check element may include a diode. The diode may be a body or close-coupled diode.

According to a second aspect of the invention, there is provided a method of operating a switching apparatus comprising first and second current paths, each current path configured to be capable of conducting an electrical current, the first current path including a first switching element connected in parallel with a first passive current check element, the method comprising the steps of:

switching the first switching element at a first intra-current path switching speed to commutate the electrical current between the first switching element and the first passive current check element; and switching the first switching element at a first inter-current path switching speed to commutate the electrical current between the first and second current paths, wherein the first intra-current path switching speed is faster or slower than the first inter-current path switching speed.

The advantages of the switching apparatus of the first aspect of the invention and its embodiments apply mutatis mutandis to the method of the second aspect of the invention and its embodiments.

The method of the invention may include the step of setting the intra-current path switching speed to regulate, preferably minimise, switching loss in the switching apparatus.

The method of the invention may include the step of setting the inter-current path switching speed to regulate, preferably minimise, voltage transient in the switching apparatus.

When the second current path includes a second switching element, the method of the invention may include the step of switching the second switching element at a second inter-current path switching speed to commutate the electrical current between the first and second current paths, and the first intra-current path switching speed may be faster or slower than the second inter-current path switching speed.

When the second current path includes the second switching element connected in parallel with a second passive current check element, the method of the invention may include the step of switching the second switching element at a second intra-current path switching speed to commutate the electrical current between the second switching element and the second passive current check element. The second intra-current path switching speed may be faster or slower than the first inter-current path switching speed. The second intra-current path switching speed may be faster or slower than the second inter-current path switching speed.

In the method of the invention, the first intra-current path switching speed may be faster than or slower than or the same as the second intra-current path switching speed.

In the method of the invention, the first inter-current path switching speed may be faster than or slower than or the same as the second inter-current path switching speed.

The method of the invention may include the step of setting the intra-current path and inter-current path switching speeds to be the same or substantially the same when the electrical current is below a predefined current threshold.

The method of the invention may be carried out using a switching controller. The switching controller may include, for example: a plurality of single switching speed control circuits, each single switching speed control circuit configured to provide a switching signal at a respective single switching speed; and/or a variable switching speed control circuit configured to provide a switching signal at two or more switching speeds.

In the method of the invention, the or each switching element may include a transistor, such as a metal oxide semiconductor field effect transistor (MOSFET), optionally wherein the transistor may be formed of silicon carbide, and/or the or each passive current check element may include a diode, optionally wherein the diode may be a body or close-coupled diode.

It will be appreciated that the use of the terms "first" and "second", and the like, in this patent specification is merely intended to help distinguish between similar features (e.g. the first and second current paths, the first and second switching elements), and is not intended to indicate the relative importance of one feature over another feature, unless otherwise specified.

A preferred embodiment of the invention will now be described, by way of a non-limiting example, with reference to the accompanying drawings in which.

Figure 1:
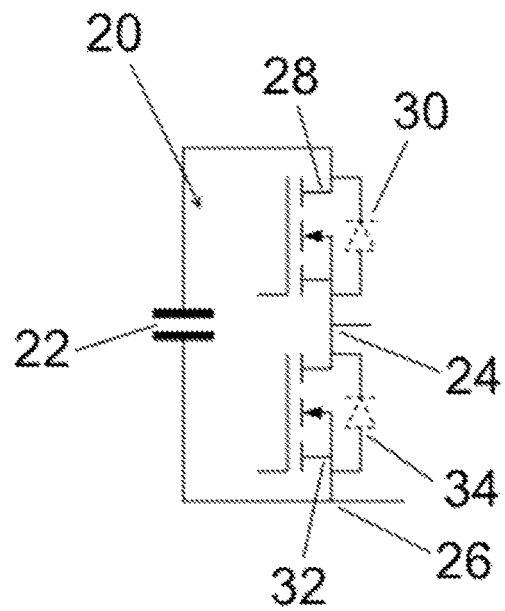
FIG. 1 shows schematically a switching apparatus according to an embodiment of the invention.

A switching apparatus according to an embodiment of the invention is shown in FIG. 1 and is designated generally by the reference numeral 20.

The switching apparatus 20 comprises first and second switching elements connected in parallel with a capacitor 22 in a half-bridge arrangement to define a half-bridge module which can provide zero or positive voltage and can conduct electrical current in both directions. The half-bridge arrangement is configured such that the first switching element is connected in series with the capacitor 22 in a first current path between two output terminals 24, 26 while the second switching element is connected in a second current path between the two output terminals 24, 26.

The first switching element constitutes a first MOSFET 28 connected in parallel with an integral first body diode 30. The second switching element constitutes a second MOSFET 32 connected in parallel with an integral second body diode 34. Each MOSFET 28, 32 defines a resistive channel which can conduct current in both directions. In use, each MOSFET 28, 32 is switchable to a reverse conduction state so that a reverse current flowing in the corresponding current path flows preferentially through that MOSFET 28, 32 than through the corresponding parallel-connected body diode 30, 34. The MOSFETs 28, 32 may be formed of silicon carbide.

The switching apparatus 20 further includes a switching controller 38 configured to selectively control the switching of the first and second MOSFETs 28, 32.

In use, the switching controller 38 controls the switching of the first and second MOSFETs 28, 32 to turn on and off in order to control the flow of electrical current through the switching apparatus 20. When the electrical current flows through the first current path and bypasses the second current path, the half-bridge module presents a positive voltage to the output terminals 24, 26. When electrical current flows through the second current path and bypasses the first current path, the half-bridge modules presents a zero voltage to the output terminals 24, 26. In order to switch between presenting a positive voltage and presenting a zero voltage to the output terminals 24, 26, the half-bridge module is operated to carry out a commutation process in which the electrical current is commutated between the first and second current paths.

Figure 2:
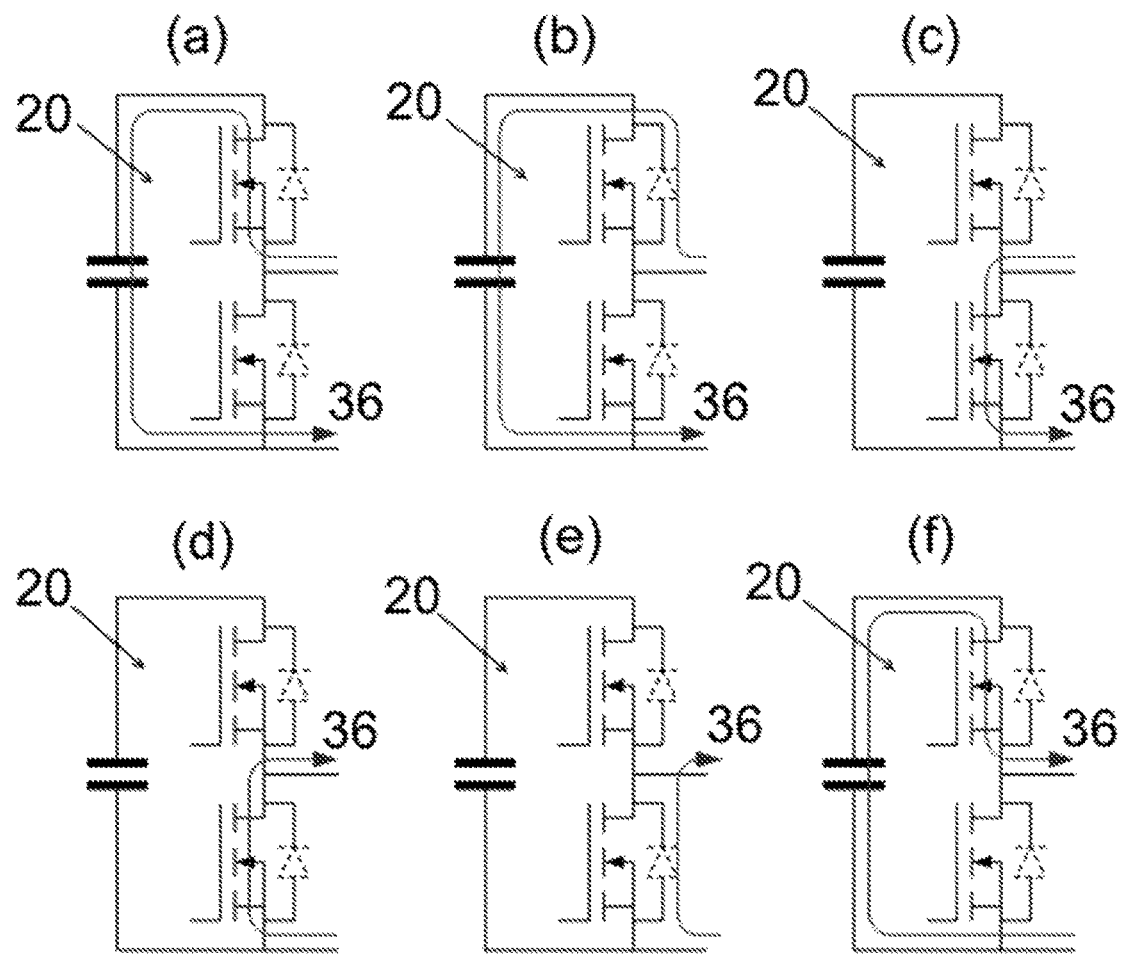
FIG. 2 illustrates different flows of electrical current in the switching apparatus of FIG. 1.

FIG. 2 illustrates the commutation process for the half-bridge module. More specifically, FIG. 2(*a*) shows the flow of reverse electrical current 36 through the first MOSFET 28, FIG. 2(*b*) shows the flow of reverse electrical current 36 through the first body diode 30, FIG. 2(*c*) shows the flow of forward electrical current 36 through the second MOSFET 32, FIG. 2(*d*) shows the flow of reverse electrical current 36 through the second MOSFET 32, FIG. 2(*e*) shows the flow of reverse electrical current 36 through the second body diode 34, and FIG. 2(*f*) shows the flow of forward electrical current 36 through the first MOSFET 28.

To avoid the risk of current shoot-through, the commutation process involves turning off a MOSFET 28, 32 carrying a reverse electrical current 36 so that it commutates from the turned-off MOSFET 28, 32 to the corresponding body diode 30, 34 before turning on the opposite MOSFET 28, 32, or turning off a MOSFET 28, 32 carrying a forward electrical current 36 so that it commutates from the turned-off MOSFET 28, 32 to the opposite body diode 30, 34 before turning on the opposite MOSFET 28, 32.

FIGS. 2(*a*), 2(*b*) and 2(*c*) in sequence illustrate a switching commutation operation in which the first MOSFET 28 is turned off to commutate the reverse electrical current 36 from the first MOSFET 28 to the first body diode 30 before the second MOSFET 32 is turned on to commutate the electrical current 36 from the first body diode 30 to the second MOSFET 32. FIGS. 2(*d*), 2(*e*) and 2(*f*) in sequence illustrate a switching commutation operation in which the second MOSFET 32 is turned off to commutate the reverse electrical current 36 from the second MOSFET 32 to the second body diode 34 before the first MOSFET 28 is turned on to commutate the electrical current 36 from the second body diode 34 to the first MOSFET 28.

FIGS. 2(*c*), 2(*b*) and 2(*a*) in sequence illustrate a switching commutation operation in which the second MOSFET 32 is turned off to commutate the forward electrical current 36 from the second MOSFET 32 to the first body diode 30 before the first MOSFET 28 is turned on to commutate the electrical current 36 from the first body diode 30 to the first MOSFET 28. FIGS. 2(*f*), 2(*e*) and 2(*d*) in sequence illustrate a switching commutation operation in which the first MOSFET 28 is turned off to commutate the forward electrical current 36 from the first MOSFET 28 to the second body diode 34 before the second MOSFET 32 is turned on to commutate the electrical current 36 from the second body diode 34 to the second MOSFET 32.

Conventionally, when a MOSFET is driven using a single switching speed gate drive, the switching speed must be set to avoid damaging voltage spikes or resonances in any commutation of the electrical current 36. This however slows down the switching speed for commutations of the electrical current 36 between a MOSFET and the corresponding body diode 30, 34 with the consequence that the body diode 30, 34 must carry the electrical current 36 for longer to avoid the risk of current shoot-through, which in turn leads to greater switching losses due to the longer diode conduction period because a body diode 30, 34 presents a high-loss conduction path when compared to the MOSFET 28, 32. It is therefore preferable to keep one or the other MOSFET 28, 32 on for as long as possible during a switching cycle.

To address the high conduction losses faced when using the conventional single-speed gate drive, the switching controller 38 is configured to be capable of controlling the switching of the MOSFETs 28, 32 at different switching speeds. Examples of the switching controller 38 configured in this manner are described later in this specification.

The switching controller 38 is configured to selectively switch the first MOSFET 28 at a first intra-current path switching speed to commutate the electrical current 36 from/to the first MOSFET 28 to/from the first body diode 30, and to selectively switch the second MOSFET 32 at a second intra-current path switching speed to commutate the electrical current 36 from/to the second MOSFET 32 to/from the second body diode 34. The term "intra-current path" refers to the electrical current 36 staying in the same current path while commutating between the MOSFET 28, 32 and the corresponding body diode 30, 34.

The switching controller 38 is also configured to selectively switch the first MOSFET 28 at a first inter-current path switching speed to commutate the electrical current 36 from/to the first MOSFET 28 to/from the opposite body diode 34, and to selectively switch the second MOSFET 32 at a second inter-current path switching speed to commutate the electrical current 36 from/to the second MOSFET 32 to/from the opposite body diode 30. The term "inter-current path" refers to the electrical current 36 commutating between the first and second current paths while commutating between the MOSFET 28, 32 and the opposite body diode 30, 34.

In the embodiment shown, each of the first and second intra-current path switching speeds is set by the switching controller 38 to be faster than each of the first and second inter-current path switching speeds. The commutation of the electrical current 36 between the first or second MOSFET 28, 32 and the corresponding body diode 30, 34 yields a small commutation inductance which can accommodate a high rate of change of current (and therefore permits the use of the faster intra-current path switching speeds) without the risk of generating undesirable voltage spikes. On the other hand, the commutation of the electrical current 36 between the first or second MOSFET 28, 32 and the opposite body diode 30, 34 yields a large commutation inductance which can only accommodate a low rate of change of current (and therefore only permits the use of the slower inter-current path switching speeds) in order to avoid the risk of generating the undesirable voltage spikes.

The use of the faster intra-current path switching speeds for the switching commutation operation to commutate the electrical current 36 between a MOSFET 28, 32 and the corresponding body diode 30, 34 in the same current path allows the diode conduction periods to be kept low to minimise switching losses while the use of the slower inter-current path switching speeds for the switching commutation operation to commutate the electrical current 36 between current paths prevents the occurrence of voltage spikes and ringing. This provides a more optimal and efficient performance of the switching apparatus 20 when compared to using the same switching speed for both of the switching commutation operations.

The first intra-current path switching speed may be set by the switching controller 38 to be faster than or slower than or the same as the second intra-current path switching speed, and the first inter-current path switching speed may be set by the switching controller 38 to be faster than or slower than or the same as the second inter-current path switching speed. Different combinations of the first and second intra-current path switching speeds and the first and second inter-current path switching speeds are therefore possible.

The switching controller 38 may vary in configuration in order to be capable of controlling the switching of the MOSFETs 28, 32 at different switching speeds.

Figure 3:
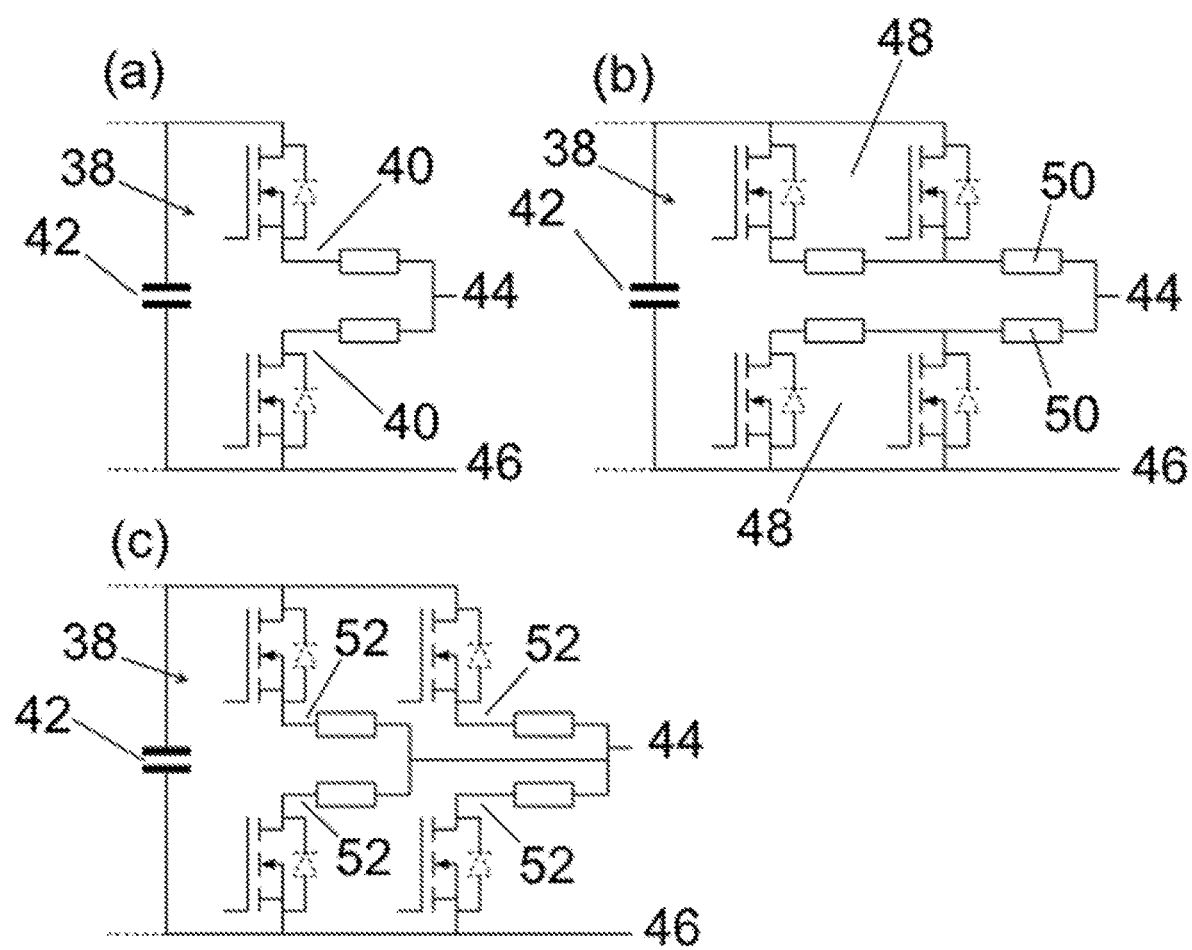
FIG. 3 shows schematically examples of the switching controller of the switching apparatus of FIG. 1.

The switching controller 38 may include multiple single switching speed gate drives to provide a switching signal to control the switching of a given MOSFET 28, 32 at respective different switching speeds. FIG. 3(a) shows an example of a single switching speed gate drive. The single switching speed gate drive of FIG. 3(a) comprises a pair of switch-resistor series connections 40 connected in parallel with a DC voltage source 42 in a half-bridge arrangement which is connected to gate and source terminals 44, 46 of a MOSFET 28, 32 of the switching apparatus 20.

The switching controller 38 may include a variable switching speed gate drive configured to provide a switching signal to control the switching of a given MOSFET 28, 32 at different switching speeds. FIG. 3(b) shows an example of a variable switching speed gate drive for controlling the switching of a MOSFET 28, 32 at two switching speeds. The variable switching speed gate drive of FIG. 3(b) is identical to the single switching speed gate drive of FIG. 3(a) except that, in the variable switching speed gate drive of FIG. 3(b), each switch-resistor series connection 40 is replaced by a parallel connection 48 of a switch-resistor series connection and a switch where each parallel connection 48 is connected in series with a respective further resistor 50.

FIG. 3(c) shows an example of a variable switching speed gate drive for controlling the switching of a given MOSFET 28, 32 at three switching speeds. The variable switching speed gate drive of FIG. 3(c) comprises two pairs of switch-resistor series connections 52 connected in parallel with a DC voltage source 42 in a full-bridge arrangement which is connected to gate and source terminals 44, 46 of a MOSFET of the switching apparatus 20. The first two switching speeds can be used as the faster intra-current path switching speeds and the slower inter-current path switching speeds respectively, while the third switching speed may be useful for turning off the MOSFET 28, 32 slowly in the presence of a fault current in the switching apparatus 20 so as to limit voltage spikes.

In the above three examples of the switching controller 38, each switch constitutes a MOSFET connected in parallel with a body diode, but may have a different switch configuration in other embodiments of the invention.

The direction of the electrical current 36 must be known in order to determine the current paths and the components involved in a given switching commutation operation as well as the change in state (on-to-off or off-to-on) of the MOSFET 28, 32 involved in the given switching commutation operation. As there may be uncertainty about the direction of the electrical current 36 in the switching apparatus 20, when the electrical current 36 approaches zero below a predefined current threshold, the switching controller 38 may increase the intra-current path switching speeds to be the same (or substantially the same) as the inter-current path switching speeds, since switching losses are minimal at near-zero current levels. If excessive voltage transient or ringing is not expected to occur at such low current levels, the switching controller 38 may instead decrease the inter-current path switching speeds to be the same (or substantially the same) as the intra-current path switching speeds in order to speed up the switching commutation operations.

It will be appreciated that the switching apparatus 20 in the embodiment shown is selected to help illustrate the working of the invention, and is not intended to be limiting on the scope of applications to which the switching apparatus 20 can be applied. The switching apparatus 20 may be applicable to other types of switching apparatus requiring a commutation of an electrical current between multiple current paths.

It will also be appreciated that the type and number of components in the switching apparatus 20 may vary depending on its design requirements. It is envisaged that, in other embodiments of the invention, the first switching element may be replaced by a plurality of first switching elements (e.g. series-connected and/or parallel-connected first switching elements), the second switching element may be replaced by a plurality of second switching elements (e.g. series-connected and/or parallel-connected second switching elements), the first passive current check element may be replaced by a plurality of first passive current check elements (e.g. series-connected and/or parallel-connected first passive current check elements), and the second passive current check element may be replaced by a plurality of second passive current check elements (e.g. series-connected and/or parallel-connected second passive current check elements).

It is also envisaged that, in still other embodiments of the invention, each MOSFET 28, 32 may be replaced by another type of semiconductor switching device, each diode may be replaced by another type of passive current check element that limits current flow to only one direction, and/or each capacitor 22 may be replaced by another type of energy storage device that is capable of storing and releasing energy to selectively provide a voltage, e.g. a fuel cell or battery.

The invention claimed is:

1. A switching apparatus comprising first and second current paths, each current path configured to be capable of conducting an electrical current, the first current path including a first switching element connected in parallel with a diode, the switching apparatus further including a switching controller configured to selectively control the switching of the first switching element, wherein based at least in part on whether the switching apparatus is operating in an intra-current path or an inter-current path, the switching controller is configured to selectively switch the first switching element at a first intra-current path switching speed to commutate the electrical current between the first switching element and the diode, or the switching controller is configured to selectively switch the first switching element at a first inter-current path switching speed to commutate the electrical current between the first and second current paths, and the first intra-current path switching speed is faster or slower than the first inter-current path switching speed.

2. The switching apparatus according to claim 1 wherein the switching controller is configured to set the intra-current path switching speed to regulate switching loss in the switching apparatus.

3. The switching apparatus according to claim 1 wherein the switching controller is configured to set the inter-current path switching speed to regulate voltage transient and/or ringing in the switching apparatus.

4. The switching apparatus according to claim 1 wherein the second current path includes a second switching element, the switching controller is configured to selectively switch the second switching element at a second inter-current path switching speed to commutate the electrical current between the first and second current paths, and the first intra-current path switching speed is faster or slower than the second inter-current path switching speed.

5. The switching apparatus according to claim 4 wherein the second current path includes the second switching element connected in parallel with a second passive current check element, the switching controller configured to selectively switch the second switching element at a second intra-current path switching speed to commutate the electrical current between the second switching element and the second passive current check element, and wherein the second intra-current path switching speed is faster or slower than the first inter-current path switching speed and/or the second intra-current path switching speed is faster or slower than the second inter-current path switching speed.

6. The switching apparatus according to claim 5 wherein the first intra-current path switching speed is faster than or slower than or the same as the second intra-current path switching speed.

7. The switching apparatus according to claim 4 wherein the first inter-current path switching speed is faster than or slower than or the same as the second inter-current path switching speed.

8. The switching apparatus according to claim 1 wherein the switching controller is configured to selectively set the intra-current path and inter-current path switching speeds to be the same or substantially the same when the electrical current is below a predefined current threshold.

9. The switching apparatus according to claim 1 wherein the switching controller includes: a plurality of single switching speed control circuits, each single switching speed control circuit configured to provide a switching signal at a respective single switching speed; and/or a variable switching speed control circuit configured to provide a switching signal at two or more switching speeds.

10. The switching apparatus according to claim 1 wherein the or each switching element is configured to be switchable to a reverse conduction state so that a reverse current flowing in the corresponding current path flows preferentially through that switching element than through the corresponding parallel-connected passive current check element.

11. The switching apparatus according to claim 1 wherein the or each switching element includes a transistor.

12. The switching apparatus according to claim 11 wherein the transistor is formed of silicon carbide.

13. The switching apparatus according to claim 1 wherein the or each passive current check element includes a diode.

14. The switching apparatus according to claim 13 wherein the diode is a body or close-coupled diode.

15. A method of operating a switching apparatus comprising first and second current paths, each current path configured to be capable of conducting an electrical current, the first current path including a first switching element connected in parallel with a diode, the method comprising:
based at least in part on whether the switching apparatus is operating in an intra-current path or an inter-current path:
switching the first switching element at a first intra-current path switching speed to commutate the electrical current between the first switching element and the first passive current check element; or
switching the first switching element at a first inter-current path switching speed to commutate the electrical current between the first and second current paths,
wherein the first intra-current path switching speed is faster or slower than the first inter-current path switching speed.

* * * * *